United States Patent [19]
Maltz

[11] 3,900,800
[45] Aug. 19, 1975

[54] HIGH VOLTAGE AMPLIFIER

[75] Inventor: Martin Sidney Maltz, Irondequoit, N.Y.

[73] Assignee: Xerox Corporation, Stamford, Conn.

[22] Filed: Jan. 22, 1973

[21] Appl. No.: 325,766

[52] U.S. Cl. .................... 330/15; 330/18; 330/19; 330/207 P
[51] Int. Cl. .................... H03f 3/26
[58] Field of Search .......... 330/15, 18, 24, 19, 28, 330/207 P

[56] References Cited

UNITED STATES PATENTS

| | | | |
|---|---|---|---|
| 3,259,848 | 7/1966 | Rado | 330/18 |
| 3,349,336 | 10/1967 | Luna | 330/18 X |
| 3,603,892 | 9/1971 | Paine | 330/18 X |
| 3,622,899 | 11/1971 | Eisenberg | 330/15 X |

FOREIGN PATENTS OR APPLICATIONS

| | | | |
|---|---|---|---|
| 265,164 | 1/1965 | Australia | 330/18 X |

*Primary Examiner*—R. V. Rolinec
*Assistant Examiner*—Lawrence J. Dahl

[57] ABSTRACT

A high speed, high voltage DC coupled linear amplifier includes a series string of transistor amplifying stages, means for biasing the junctions of each of the transistors substantially equal, means for enhancing the response speed of the amplifier and means for protecting the transistors. In another embodiment, an upper and a lower string of the aforementioned type of amplifiers are connected by means of a diode to operate the two strings in a push-pull fashion in response to an input signal.

3 Claims, 5 Drawing Figures

HIGH VOLTAGE AMPLIFIER

BACKGROUND OF THE INVENTION

This invention relates to amplifiers in general and more specifically to a solid state high speed, high voltage DC coupled amplifier with low output impedence.

Solid state amplifiers capable of providing high voltage output are extensively utilized in many areas of application requiring a high output power for driving load circuits, as is the case where an amplifier output is utilized to drive motors and the like driving mechanical members. Various solid state amplifiers of different design have been developed to meet the need. One such approach has been to provide an amplifier having a plurality of transistor amplifying stages connected in a series string and biased by a series chain of potentiometers which provide substantially equal amount of biasing potentials across each of the transistor amplifying stages. In such an arrangement usually the input is applied to a transistor at one end of the string and the output is derived from the transistor at the other end of the string. Variation to such design has been to utilize a pair of series strings wherein the two strings are arranged to operate in a push-pull fashion.

These and other types of the amplifiers known heretofore have been found to be deficient in a number of ways. Thus, for example, as a practical matter, it has been found difficult to find the transistors and accompanying potentiometer elements which have exactly the same physical characteristics required in the amplifier so that it may provide a satisfactory linear response. It is also found that conventional solid state amplifiers of the aforementioned design are slow in response at a high frequency spectrum in which the amplifier is often required to operate and is limited in its output current capability. There are some amplifiers which are designed to overcome some of the foregoing shortcomings but they tend to be extremely complex in structure and costly to manufacture.

It is an object of the present invention to provide an improved high speed, high voltage amplifier of a simplified structure. It is another object of the present invention to provide an improved high speed, high voltage, DC coupled amplifier with low output impedence. It is still another object of the present invention to provide a high speed, high voltage, solid state linear amplifier which overcomes one or more of the shortcomings found in the conventional solid state amplifiers.

The foregoing and other objects of the present invention are achieved in accordance with the present invention by an amplifier which includes a plurality of transistors connected in series, resistive means for applying substantially equal potential between the base and collector of a transistor, and the base and collector of the previous transistor in the series string means in shunt with the resistive means for enhancing the response speed of the transistors, and means for preventing a large reverse voltage from being applied across the junction between the base and emitter of the transistor to prevent its destruction.

In accordance with another aspect of the present invention, a high speed, high voltage DC coupled linear amplifier includes an upper and a lower string of transistors, each string comprising a plurality of transistors connected in series, means for increasing the response speed of the amplifier, means for preventing the application of a destructive voltage across a junction of each of the transistors, and means for connecting the upper and lower strings so that the lower string drives the output and controls the operation of the upper string which also drives the output.

In accordance with still another aspect of the present invention, the amplifier is designed so that any number of transistors may be connected in series to provide a high voltage amplification and yet the amplifier so assembled is relatively insensitive to the unbalancing effects of the base currents that flow in the presence of a high output current.

Still another aspect of the present invention resides in the fact that the frequency response of the amplifier at high frequency is significantly improved without unbalancing the voltage response.

Still another aspect of the present invention is in the provision of two strings of the amplifiers which are connected together to operate in a push-pull fashion so that they provide a very low output impedence without requiring the need for floating the input driving signal and thereby eliminating the need for input transformers which would otherwise be required and which would otherwise significantly deteriorate the frequency response of the amplifier.

It is still a further aspect of the present invention in that the amplifier is designed to draw little quiescent current but drive large loads and consume only a small portion of the input power for the biasing and load resistor networks.

It is still another aspect of the amplifier that it provides a negative feedback from the output to input thereby greatly improving the linearity of the response characteristics of the amplifiers.

It is still another aspect of the present amplifier that it requires a minimum number of inexpensive components per stage of the transistor string.

The foregoing and other objects and features of the present invention will become clearer from the illustrative embodiments of the present invention described in detail below in conjunction with the accompanying drawings, in which FIG. 1A shows an illustrative embodiment of a high voltage, high speed DC coupled linear amplifier in accordance with the present invention.

FIG. 1B shows an amplifying stage used as a building block of the amplifier shown in FIG. 1A.

FIGS. 2A and 2B when connected as shown in FIG. 3 show still another illustrative embodiment of a high voltage high speed DC coupled linear amplifier according to the present invention.

DETAILED DESCRIPTION OF THE INVENTION

Figures 1A, 1B, 3:
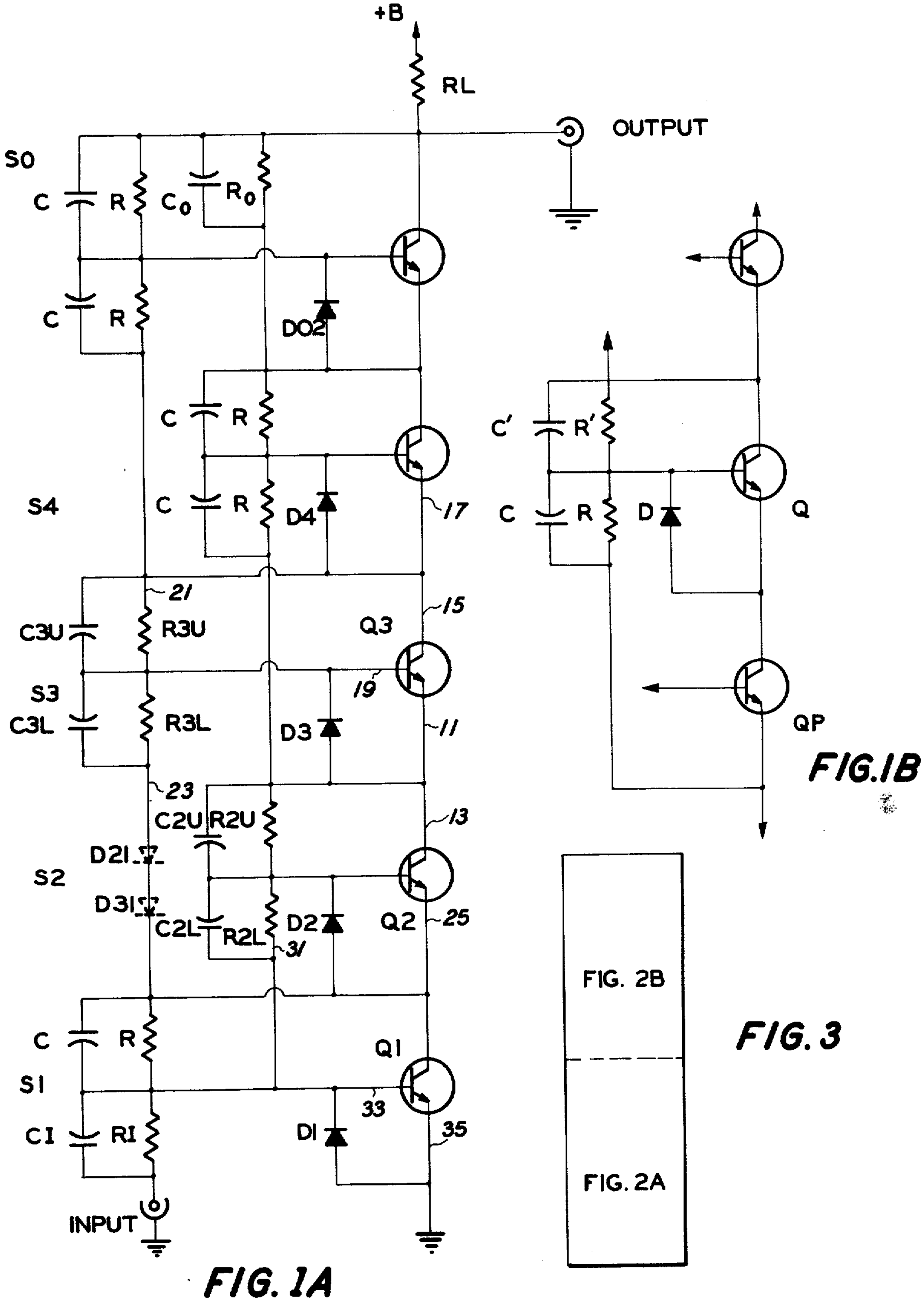

In accordance with the present invention, as illustrated in FIG. 1A, a string of transistors are connected in series and are uniquely biased and are provided with response speed enhancing means, to provide a high speed, high voltage DC coupled linear amplifier with low output impedence. Because of the unique design of the amplifier, the magnitude of the output voltage of the amplifier is in principle unlimited in that the number of stages of the transistors that may be connected is unlimited and that the output voltage is proportional to the number of the amplifying transistors that may be connected. As shown in FIG. 1B, basically each of the amplifying stages includes an active element such as an NPN transistor Q and potential dividing resistive means for R and R′ for biasing the transistors, capactivie means C and C' in shunt therewith for speeding up the response characteristic of the active element, and a diode means D for limiting the reverse voltage across a junction of the active element. More specifically, the resistors R and R' are proportioned so that the potential between the collector and base of transistor Q is essentially equal to the potential between the collector and base of the transistor QP in the previous stage of the series string, and the diode D is poled to prevent an application of a reverse potential across the emitter and base junction that would otherwise destroy the transistor. The amplifying stage as shown in FIG. 1B is used as a building block and connected in series as shown in FIG. 1A. Thus, the building block is used as intermediate stages S2, S3 and S4 without any modifications and as an input stage S1 and an output state S0 with slight modifications. In the intermediate stages, such as S3, the emitter electrode 11 collector-base one stage S3 is connected to the collector electrode 13 of the potential stages S2 and its collector electrode 15 is connected to the emitter electrode 17 of the succeeding stage S4. The base electrode 19 is connected to a center of the potential dividing resistors R3U and R3L of the building block. One end 21 of the resistors R3U is connected to the collector 15 of the transistor Q3 and the other end 23 of the resistor R3L is connected to the emitter electrode 25 of the preceeding stage S2. The potential dividing resistors R3L and R3U adjust the collector-base voltage of the transistor Q3 so that it is substantially equal to the voltage between the base electrode 19 of the same stage S3 and the emitter electrode 25 of the transistor Q2 of the preceeding stage S2. Since the potential between the base electrode 19 of stage S3 and the emitter electrode 25 of transistor Q2 is equal to the sum of the emitter to base potential of Q3, the collector to base potential of Q2, and the emitter to base potential of Q2, and the emitter to base potentials are generally much smaller than the collector to base potential, the potential between electrodes 19 and 25 is approximately equal to the collector to base potential of transistor Q2. As a result, the collector-base voltage of the transistor Q3 is made approximately equal to that of the transistor Q2 of the preceeding stage S2. In this manner, the collector-base voltage of the successive stages are maintained substantially equal. The balance can be further improved by compensating for the emitter to base voltages by putting two diodes D21 and D31 in series in every stage as shown (dotted), but this is usually unnecessary in a high voltage amplifier, where the emitter to base voltages are negligible compared to the collectorbase voltage. The capacitors C3L and C3U are connected in shunt with the potention dividing resistors R3L and R3U in the manner shown to counteract the deleterious effect of the junction capacitance of the transistor and thereby enhance the response speed of each of the amplifying stages.

The diode D connected in the manner shown across the base to emitter electrodes of the respective stages provides a bipass to protect the transistor Q. Thus, when the base-to-emitter is forward biased during the operation, current flows therethrough and establishes a typical low junction voltage. However, when the junction voltage becomes reverse biased, the diode provides a bipass for the current so that a large reverse voltage which otherwise destroy the transistor is prevented from being applied across the junction between the base and emitter electrodes.

For the input stage S1, the building block shown in FIG. 1B is somewhat modified. Thus, as illustrated in FIG. 1A at the lower or the negative end of the amplifier, the lower terminal 31 of the voltage divider R2L and R2U of the intermediate stage S2 is connected to the base electrode 33 of the transistor Q1 of the input stage S1 rather than its emitter electrode 35, as would otherwise be in the intermediate stage. This reduces the impedence of the negative feedback to the base electrode 33 of the transistor Q1, thereby improving the linear response characteristics of the amplifier and decreasing the output impedence of the amplifier. The value of the input resistor RI is selected to give the desired amplification factor for the amplifier and the input capacitor CI is selected to provide desired frequency response of the amplifier. Unduly large capacitance for the input capacitance CI will tend to cause certain amount of overshoot in the response of the amplifier. Accordingly, the capacitance of the coupling capacitor CI should be so selected that the response speed and stabilization of the output is optimized to meet the specific needs. Thus, for example, where response speed is of the essence and overshoot may not be critical, larger capacitance for the capacitor CI could be used whereas if the stabilization is the more important consideration, than a capacitor of a smaller magnitude should be used to minimize the overshoot.

As shown in FIG. 1A the output end of the amplifier may be terminated with a passive resistive element RL. For the output stage S0, the building block FIG. 1B is modified and connected to the penultimate stage S4. Thus, instead of a voltage divider, an RC combination R0 and C0 is connected between the collector electrodes of the last two stages. The amplifier illustrated in FIG. 1A terminated with a simple passive pull up resistor RL as shown, is satisfactory in many ways. However, it tends to reduce the ability of the amplifier to drive loads positive and to decrease the high frequency response of the amplifier and to require a very high power load resistor. This is overcome by an amplifier of a modified design as shown in FIGS. 2A and 2B as described below.

Figure 2A:
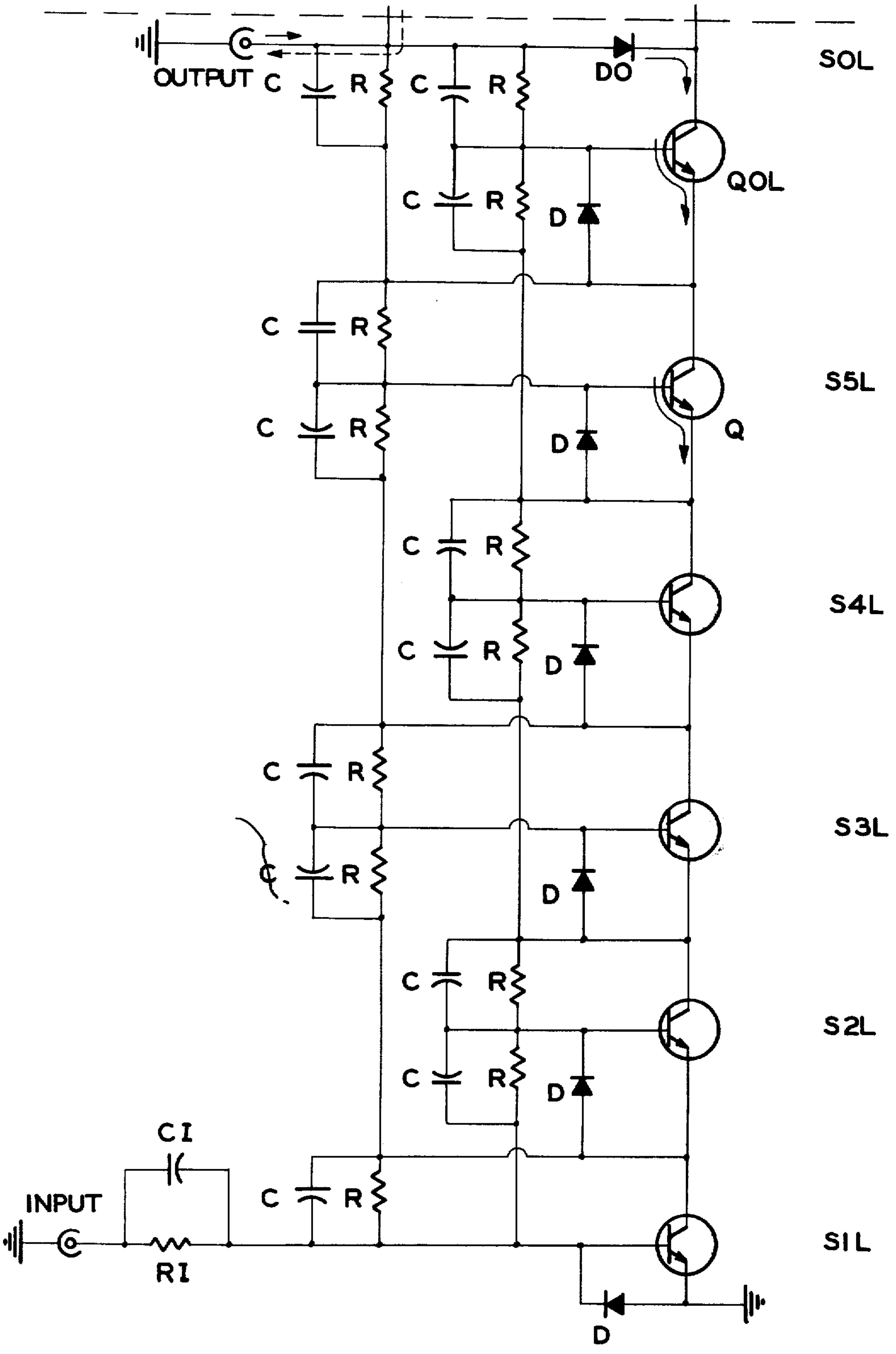
Figure 2B:
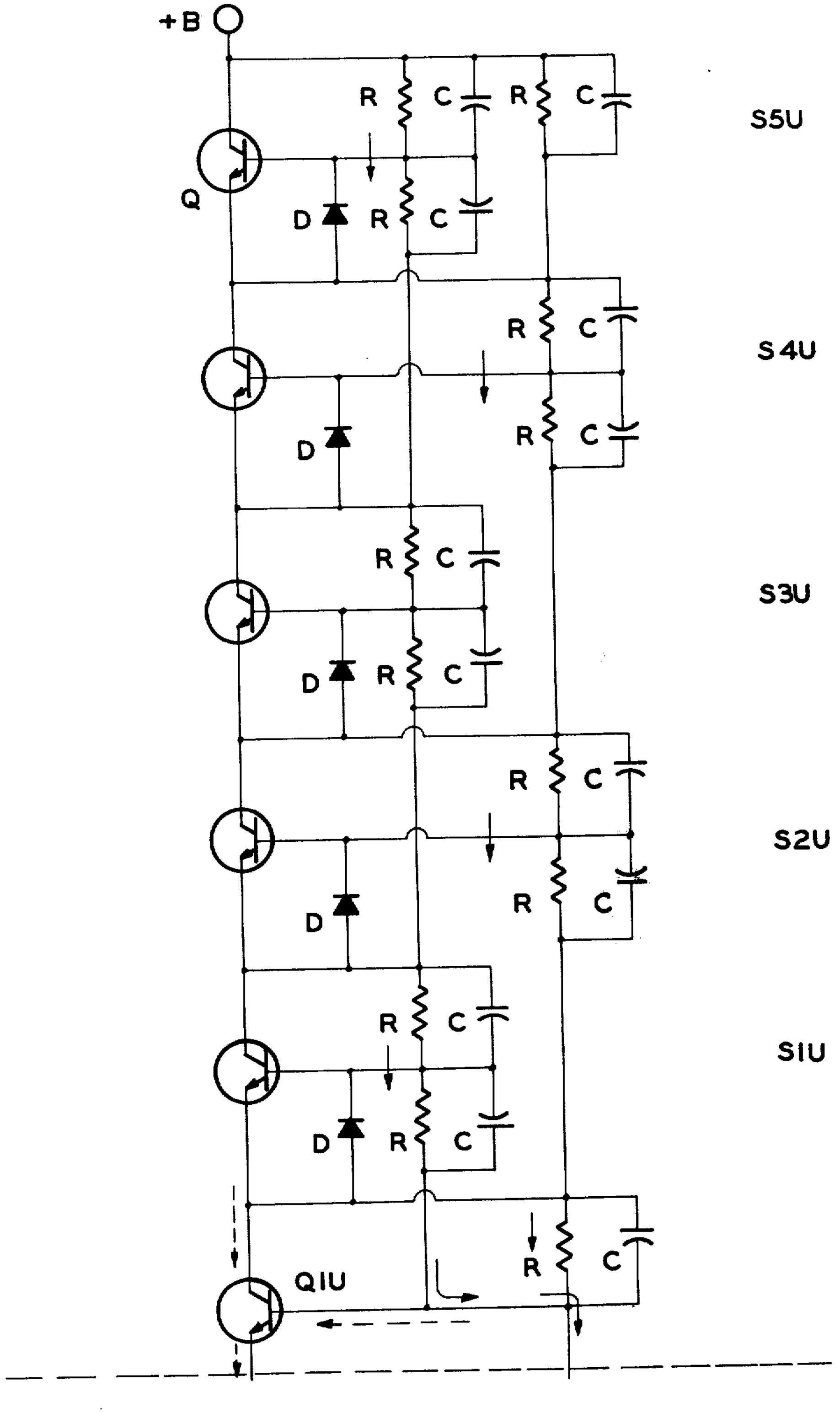

As shown in FIGS. 2A and 2B, the modified design according to the present invention includes two strings of transistor amplifier stages joined together as shown in FIG. 3 so that one string controls the operation of the other. The upper string, FIG. 2B, is connected between the positive bias voltage source B+ and the output. The lower string FIG. 2A is connected between the input and the output as shown. The two strings are so connected that the output is driven negative when the lower string is driven on while the upper string is driven off and that the output is driven positive when the lower string is driven off by the input while the upper string is driven on. Thus, in short, the upper and lower strings are driven on and off in a push-pull fashion in response to an input signal and this action gives the amplifier its high efficiency and low output impedence.

Since the input signal is introduced only at the bottom of the lower string (FIG. 2A), the lower string must not only drive the output but also control the operation of the upper string (FIG. 2B). This is made possible through the use of a diode D0 connected between the upper and lower string as shown. With the lower string turned on in response to an input signal the current is drawn by the active element or transistors Q of the lower string from the biasing source B+ via the potential dividing resistors R as shown by heavy solid arrowed lines. This causes load current to flow through the diode D0. The load current flowing through the diode D0 and the lower string back biases the bottom transistor Q1U of the upper string and turns it off. The current flowing through the upper string resistive potential divider networks are diverted away from the base of the transistor Q1U and flows through the lower string as shown. The current driving the bottom transistor Q1U of the upper string drives off the rest of the upper string by a feedback process. In the foregoing manner, the output is driven negative rapidly.

When the lower string is turned off by the input signal, the output is driven positive in the following manner. Current flowing through the lower string active elements stops when the lower string is turned off by the input signal. When this happens, the current in the upper string RC networks flows through the base electrode of the bottom transistor Q1U of the upper string and then to the output load because it cannot flow backwards through the diode D0 nor through the lower string active elements. This current is indicated by a dotted arrowed line. This current turns on the transistors or the active elements in the upper string and causes a large current to flow into the output load and thereby drive it positive very rapidly.

Various other modifications may be made to the illustrative embodiments of the present invention described above in conjunction with the accompanying drawings without departing from the spirit and scope of the teachings of the present invention.

What is claimed is:

1. A high speed, high voltage DC coupled amplifier comprising, an upper and lower string of amplifying stages, said upper string of amplifying stages connected in series with a bias circuit for said lower string of amplifying stages and said lower string of amplifying stages connected in series with a bias circuit for said upper string of amplifying stages, wherein each of said amplifying stages includes an active element having first, second and third electrodes, first diode means connecting the third electrode of the active element of the first stage of the upper string to the first electrode of the active element of the last stage of the lower string, said diode means being so poled that it conducts and drives the output in one direction and turns off the upper string when the lower string turns on and that it turns said upper string on which drives the output in the other direction when said lower string is turned off, thereby enabling the upper and lower strings to operate in a push-pull relationship, first impedance means coupled between adjacent amplifying stages for establishing substantially equal potential across the first and second electrodes of the adjacent stages, second impedance means coupled in shunt with said first impedance means for enhancing the response speed of the amplifier, and reverse voltage preventing means coupled across said second and third electrode of said active element for preventing an application of a large reverse potential thereto.

2. The apparatus according to claim 1, wherein each active element is a transistor having collector, base and emitter electrodes as the first, second and third electrodes, said first impedance means includes first and second resistors of substantially same magnitude, said second impedance means includes first and second capacitive means in shunt with the first and second resistors respectively, and said reverse voltage preventing means includes a second diode means connected across the base and emitter electrodes of each active element in reverse polarity.

3. The apparatus according to claim 2, wherein each active element is an NPN transistor, and wherein the transistors of successive stages are connected in series in which the collector electrode of the preceding stage is connected to the emitter electrode of the succeeding stage, and, in the intermediate stages, said first resistive means is connected between the emitter electrode of the preceding stage and the base electrode of the succeeding stage, and, in between the input stage and the first intermediate stage, said first resistive means is connected between the base electrodes of the transistor of the input stage and the first intermediate stage.

* * * * *